(12) United States Patent
Nagano et al.

(10) Patent No.: US 7,432,783 B2
(45) Date of Patent: Oct. 7, 2008

(54) FILTER DEVICE SUBSTRATE AND FILTER DEVICE

(75) Inventors: Natsuyo Nagano, Daito (JP); Takashi Ogura, Kyotanabe (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 178 days.

(21) Appl. No.: 11/579,137

(22) PCT Filed: Apr. 20, 2005

(86) PCT No.: PCT/JP2005/007506

§ 371 (c)(1),
(2), (4) Date: Oct. 30, 2006

(87) PCT Pub. No.: WO2005/107068

PCT Pub. Date: Nov. 10, 2005

(65) Prior Publication Data

US 2007/0247258 A1 Oct. 25, 2007

(30) Foreign Application Priority Data

Apr. 30, 2004 (JP) ............................. 2004-135248

(51) Int. Cl.
*H03H 9/72* (2006.01)
(52) U.S. Cl. .................. 333/133; 333/193; 333/186
(58) Field of Classification Search ................. 333/133, 333/193
See application file for complete search history.

(56) References Cited

U.S. PATENT DOCUMENTS 5,162,822 A 11/1992 Wakamori 6,919,778 B2 * 7/2005 Iwamoto et al. ............ 333/133
2003/0098757 A1 5/2003 Iwamoto et al.

FOREIGN PATENT DOCUMENTS

| JP | 5-95253 A | 4/1993 |
|---|---|---|
| JP | 6-53775 A | 2/1994 |
| JP | 3-72708 A | 3/1994 |

(Continued)

OTHER PUBLICATIONS

International Search Report of PCT/JP2005/007506, date of mailing Aug. 9, 2005.

*Primary Examiner*—Benny Lee
*Assistant Examiner*—Eric R Hamill
(74) *Attorney, Agent, or Firm*—Westerman, Hattori, Daniels & Adrian, LLP.

(57) ABSTRACT

A filter device substrate 1 of the present invention is formed by stacking a plurality of ceramic layers 12, 14, and includes a filter chip mounting portion for mounting a transmission filter chip 2 and a reception filter chip 3. Arranged on a surface of one ceramic layer 12 are a signal input pad 73, a signal output pad 7, a signal input side ground pattern 44 and a signal output side ground pattern 43 for connecting a signal input terminal C, a signal output terminal D, a signal input side ground terminal G and a signal output side ground terminal G, respectively, of the reception filter chip 3. The signal input side ground pattern 44 and the signal output side ground pattern 43 are connected to each other by a connection wiring pattern 45 on the surface of the one ceramic layer 12.

5 Claims, 10 Drawing Sheets

FOREIGN PATENT DOCUMENTS

| | | |
|---|---|---|
| JP | 6-97315 A | 4/1994 |
| JP | 10-284976 A | 10/1998 |
| JP | 11-340781 A | 12/1999 |
| JP | 2003-307383 A | 11/2000 |
| JP | 2002-158449 A | 5/2002 |
| JP | 2003-163570 A | 6/2003 |
| JP | 2003-304139 A | 10/2003 |
| JP | 2004-80233 A | 3/2004 |

* cited by examiner

FILTER DEVICE SUBSTRATE AND FILTER DEVICE

The priority application Number 2004-135248 upon which this patent application is based is hereby incorporated by reference.

BACKGROUND OF THE INVENTION

1. Field of the Invention

The present invention relates to a filter device, such as an antenna duplexer, for example, including at least one filter chip mounted on a substrate formed by stacking a plurality of ceramic layers.

2. Description of Related Art

Figure 10:
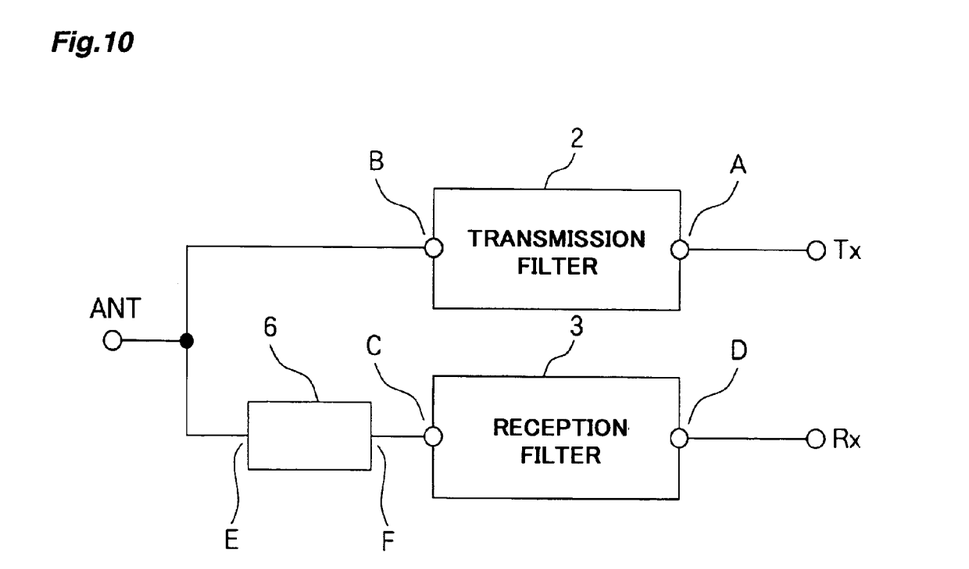
FIG. 10 is a block diagram representing a configuration of the antenna duplexer.

As shown in FIG. 10, an antenna duplexer includes an antenna terminal ANT to be connected to an antenna, a transmission side signal terminal Tx to be connected to a transmitting circuit, and a reception side signal terminal Rx to be connected to a receiving circuit. The antenna terminal ANT is connected to the transmission side signal terminal Tx via a transmission filter chip 2 including a surface acoustic wave device, and connected to the reception side signal terminal Rx via a reception filter chip 3 including a surface acoustic wave device (see JP 11-340781, A). A phase-matching strip line 6 for phase rotation is interposed between the antenna terminal ANT and the reception filter chip 3 to match the phases between the transmission filter chip 2 and the reception filter chip 3 (see JP 2000-307383, A).

Figure 11:
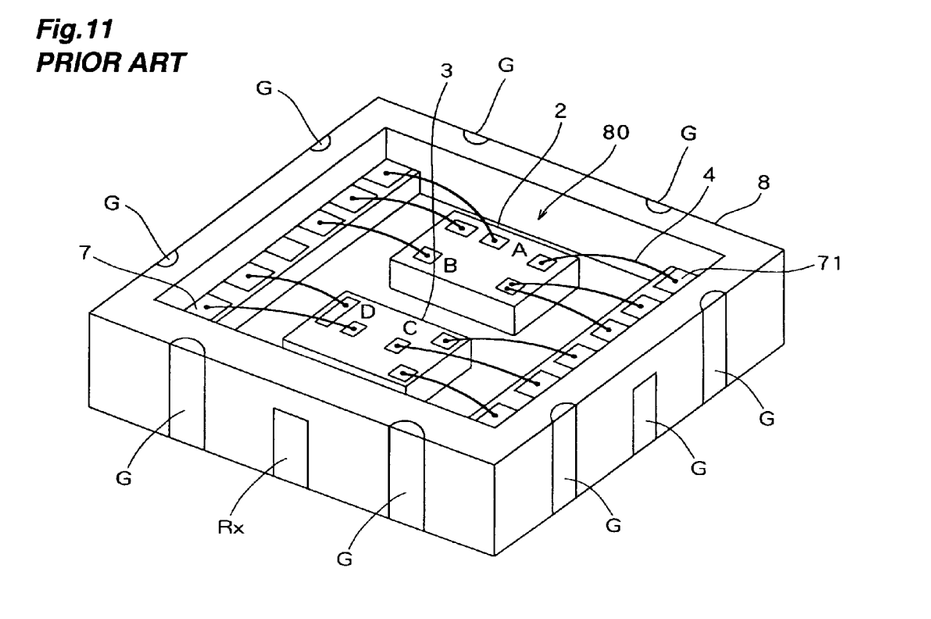
FIG. 11 is a perspective view of a conventional antenna duplexer without a lid.
Figure 12:
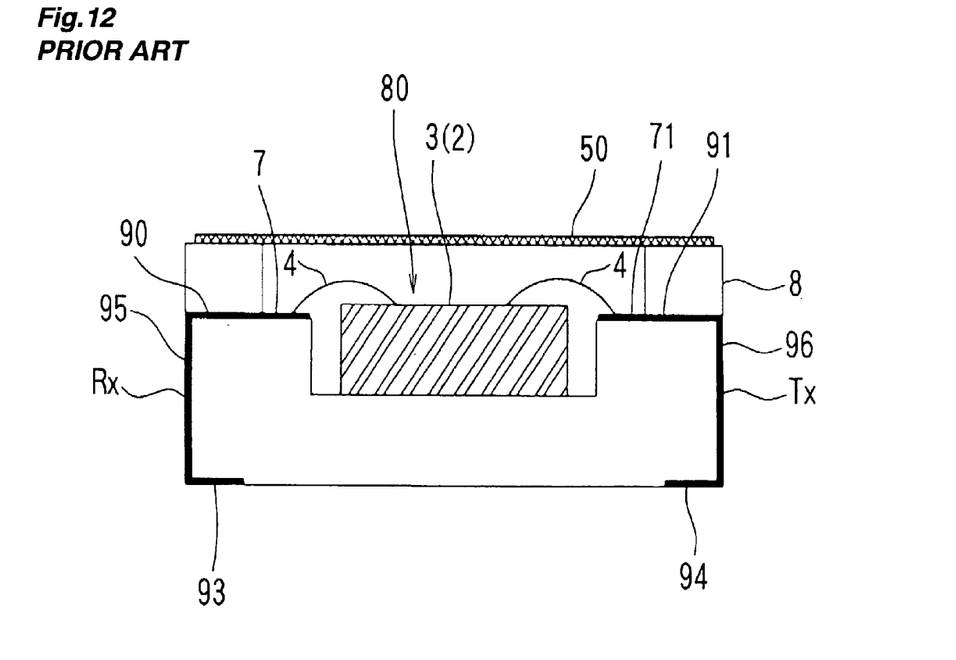
FIG. 12 is a sectional view schematically representing a structure of the conventional antenna duplexer.

FIG. 11 and FIG. 12 show the construction of the antenna duplexer enclosed in a package. A cavity 80 is provided on a surface of a substrate 8 formed by stacking a plurality of ceramic layers. The transmission filter chip 2 and the reception filter chip 3 are mounted on the bottom surface of the cavity 80. A plurality of terminals provided on these filter chips are respectively coupled by wires 4 to a plurality of pads 7, 71 arranged around. As shown in FIG. 12, a plurality of side electrodes 95, 96 for serving as a plurality of external terminals of the transmission side signal terminal Tx, the reception side signal terminal Rx, etc. are formed on side surfaces of the substrate 8. The plurality of pads 7, 71 are connected via signal wiring patterns 90, 91 and the side electrodes 95, 96 to foot terminals 93, 94 formed on the reverse surface of the substrate 8. The cavity 80 of the substrate 8 is closed by a lid 50.

Figure 13:
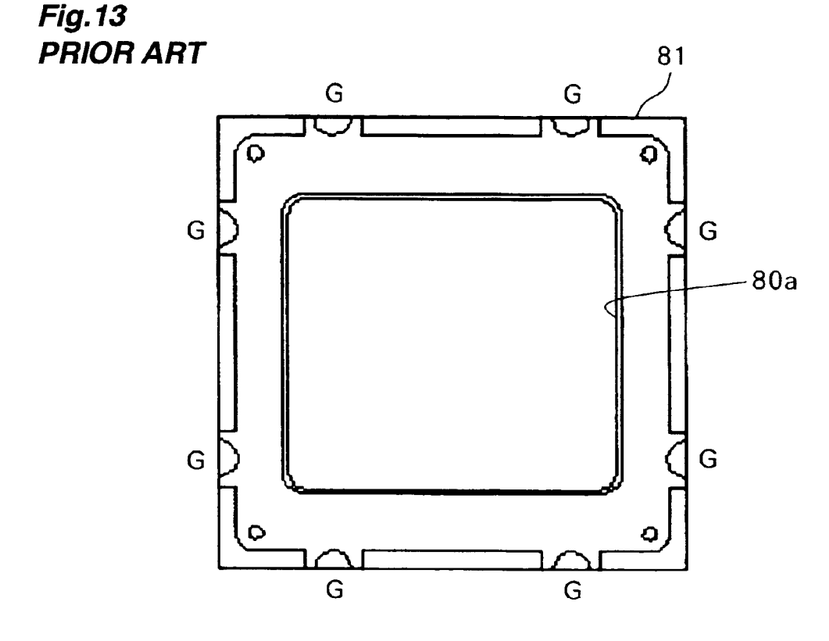
FIG. 13 is a plan view of a first ceramic layer.
Figure 14:
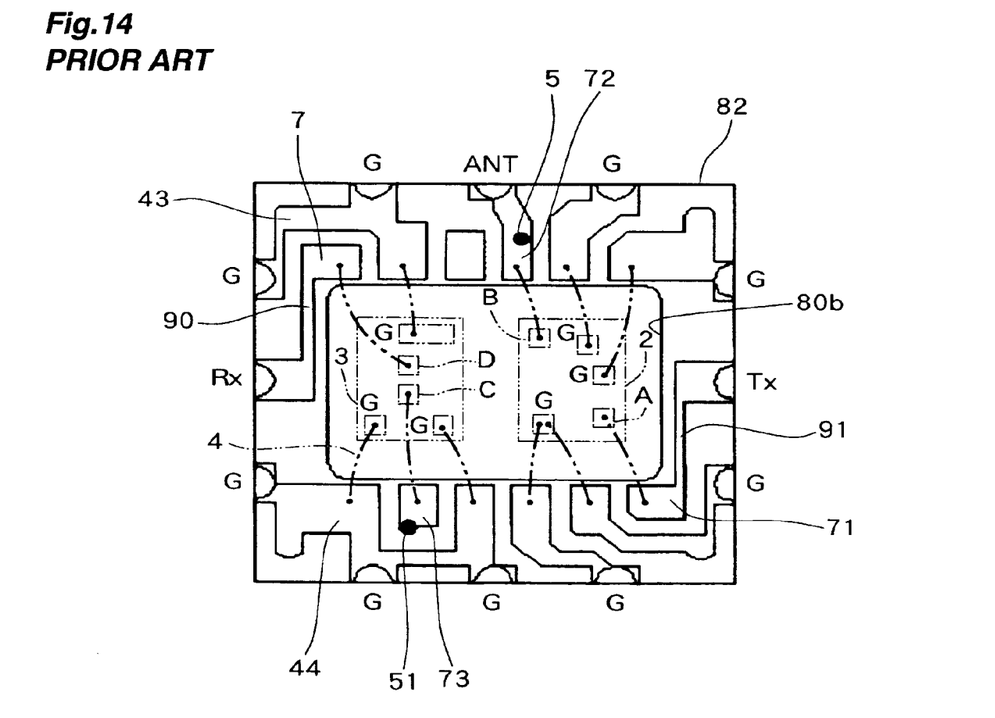
FIG. 14 is a plan view of a second ceramic layer.
Figure 15:
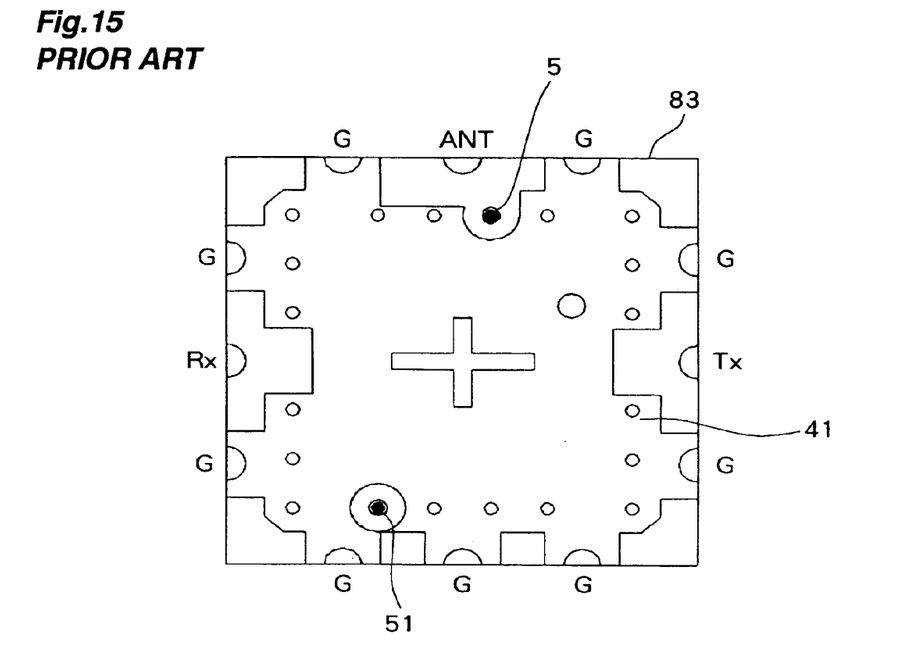
FIG. 15 is a plan view of a third ceramic layer.
Figure 16:
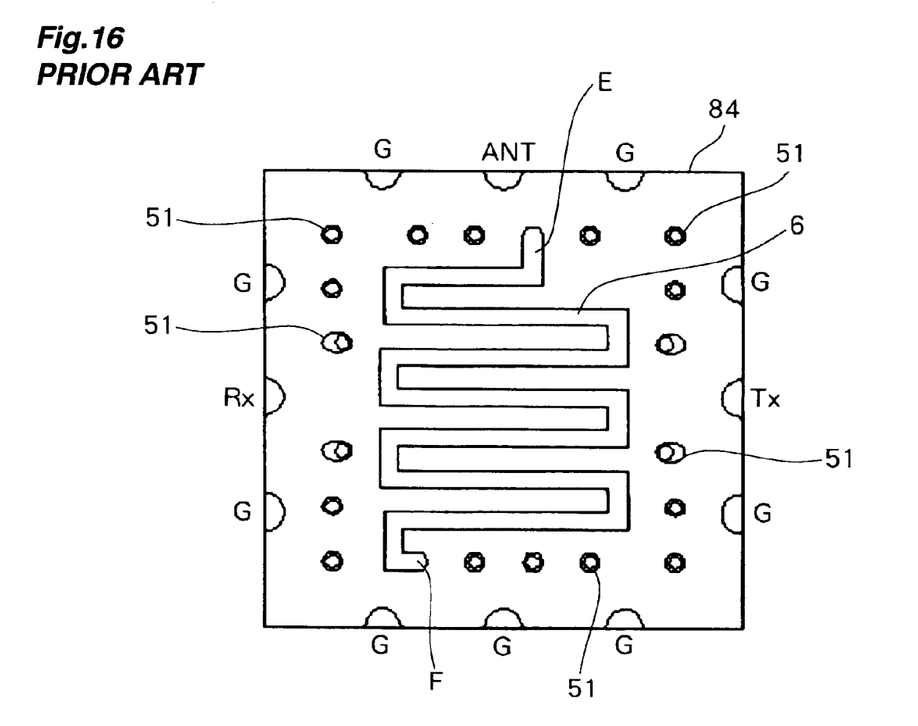
FIG. 16 is a plan view of a fourth ceramic layer.
Figure 17:
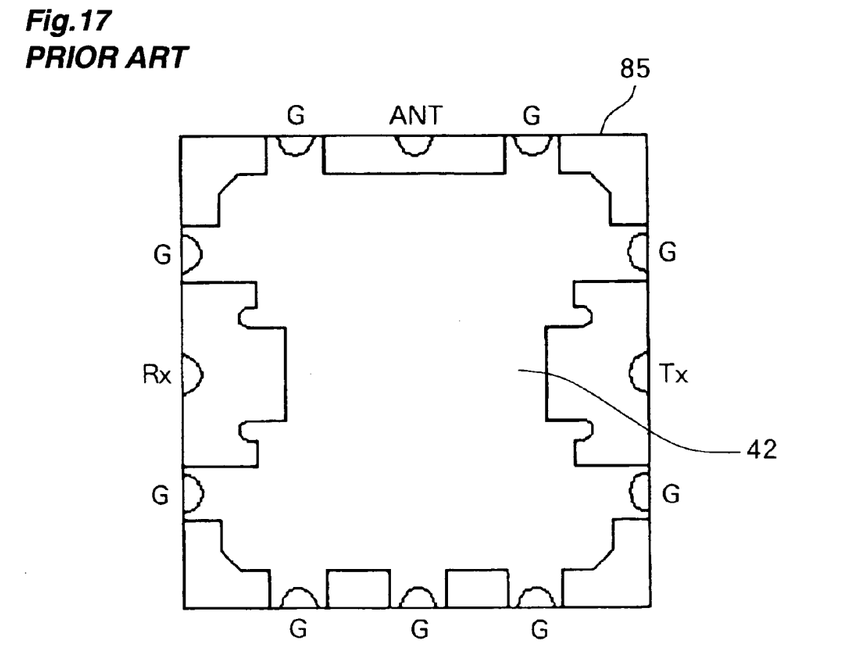
FIG. 17 is a plan view of a fifth ceramic layer.
Figure 18:
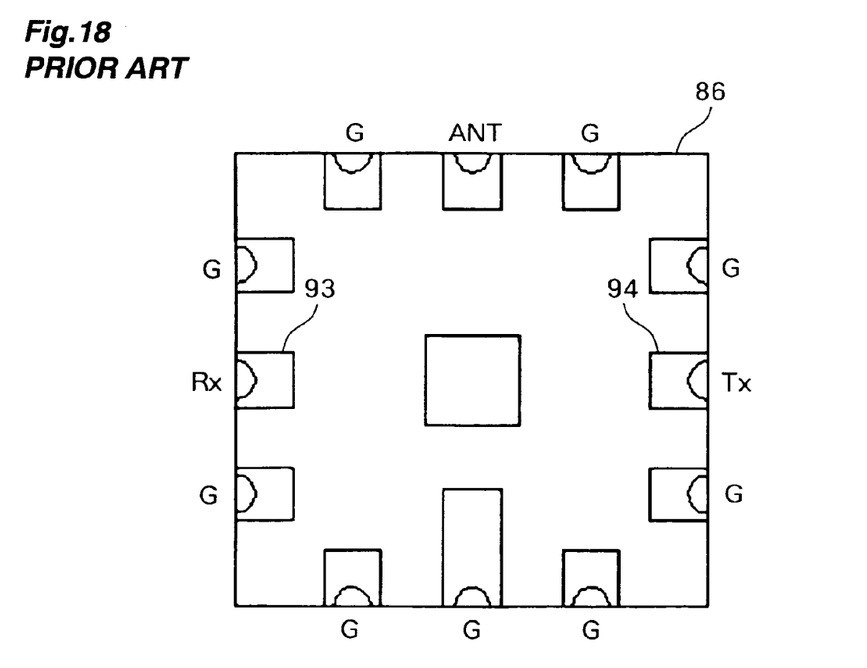
FIG. 18 is a plan view of a sixth ceramic layer.

FIG. 13 to FIG. 18 show six ceramic layers 81-86 of the substrate 8. In FIG. 11 to FIG. 18, reference characters Tx, Rx, ANT, A, B, C and D represent parts of the transmission side signal terminal Tx, the reception side signal terminal Rx, the antenna terminal ANT, input and output terminals A, B of the transmission filter chip 2 and input and output terminals C, D of the reception filter chip 3, respectively, shown in FIG. 10. Further, a reference character G represents a part of ground terminals. As shown in FIG. 13, a top first ceramic layer 81 has a cavity 80a provided at the middle thereof. As shown in FIG. 14, a cavity 80b is provided at the middle of a second ceramic layer 82. A plurality of pads 7, 71, 72, 73 to be wire-bonded with a plurality of terminals of the transmission filter chip 2 and the reception filter chip 3, ground patterns 43, 44, and a plurality of signal wiring patterns 90, 91 are formed on a surface of the ceramic layer 82, surrounding the cavity 80b. As shown in FIG. 15, a ground pattern 41 is formed on a surface of a third ceramic layer 83. The transmission filter chip 2 and the reception filter chip 3 are to be mounted on the ground pattern 41. As shown in FIG. 16, the phase-matching strip line 6 is formed on a surface of a fourth ceramic layer 84. As shown in FIG. 17, a ground pattern 42 is formed on a surface of a fifth ceramic layer 85. Further, as shown in FIG. 18, a plurality of foot terminals 93, 94 are formed on the reverse surface of a bottom sixth ceramic layer 86.

The transmission side signal terminal Tx shown in FIG. 14 is connected through the transmission side input signal wiring pattern 91 to the pad 71, and further connected via a wire to the signal input terminal A of the transmission filter chip 2. The signal output terminal B of the transmission filter chip 2 is coupled via a wire to the pad 72, and connected to the antenna terminal ANT. The pad 72 is connected to one terminal E of the phase-matching strip line 6 shown in FIG. 16 through a conductive material in a via hole (hereafter simply referred to as a via) 5 provided in the second ceramic layer 82 and the third ceramic layer 83 in FIG. 15. The other terminal F of the phase-matching strip line 6 is connected to the pad 73 shown in FIG. 14 through a via 51 provided in the third ceramic layer 83 in FIG. 15 and the second ceramic layer 82 in FIG. 14. The pad 73 is coupled by a wire to the signal input terminal C of the reception filter chip 3. The signal output terminal D of the reception filter chip 3 is coupled to the pad 7 by a wire. The pad 7 is connected through the reception side output signal wiring pattern 90 to the reception side signal terminal Rx. The reception side output signal wiring pattern 90 has an inductance component, which improves signal pass characteristics in a signal pass band of the reception filter chip 3.

As shown in FIG. 14, two ground terminals G, G at the signal input side and signal output side of the reception filter chip 3 are connected via wires to the signal input side ground pattern 44 and the signal output side ground pattern 43, respectively.

Further, the ground pattern 41 shown in FIG. 15 and the ground pattern 42 shown in FIG. 17 are connected to each other via a plurality of vias 51 provided in the fourth ceramic layer 84 as shown in FIG. 16.

In the antenna duplexer, during signal transmission, signals input to the transmission side signal terminal Tx pass through the transmission filter chip 2, and are thereafter output from the antenna terminal ANT to the antenna. At this time, it is necessary to prevent a phenomenon of the signals input to the transmission side signal terminal Tx flowing into the reception side signal terminal Rx.

Accordingly, for the conventional antenna duplexer, various isolation measures have been taken on a signal path from the transmission side signal terminal Tx through the transmission filter chip 2 and the reception filter chip 3 to the reception side signal terminal Rx. However, the conventional antenna duplexer has not yet achieved a sufficient isolation effect, but left room for further improvement.

SUMMARY OF THE INVENTION

An object of the present invention is to provide a filter device substrate and filter device capable of achieving a higher isolation effect than a conventional one with a simple structure.

A filter device substrate of the present invention includes a plurality of ceramic layers stacked on top of each other; a cavity provided for containing at least one filter chip for transmission or reception; a filter chip mounting portion for mounting the filter chip on one ceramic layer constituting a bottom surface of the cavity; and a plurality of side electrodes provided on one or more side surfaces of the plurality of stacked ceramic layers and extending in a stacked direction of the ceramic layers. Another ceramic layer different from the ceramic layer having the filter chip mounting portion has a surface provided with a signal input pad, a signal output pad, a signal input side ground pad and a signal output side ground pad for connecting a signal input terminal, a signal output terminal, a signal input side ground terminal and a signal output side ground terminal, respectively, of the filter chip, and further provided with a signal input side ground pattern and a signal output side ground pattern to be connected to the signal input side ground pad and the signal output side ground pad, respectively. The signal input side ground pattern and the signal output side ground pattern are connected to each other by a connection wiring pattern on the surface of the another ceramic layer, and the signal input pad, the signal output pad, the signal input side ground pattern and the signal output side ground pattern are respectively connected via side electrodes to foot terminals. The signal input pad or the signal output pad is located closest to a side electrode to be connected thereto of the pads of at least one pad group of an input side pad group including the signal input pad and the input side ground pad and an output side pad group including the signal output pad and the output side ground pad, and the connection wiring pattern crosses the ceramic layer surface area defined between the signal input pad or the signal output pad and at least one side electrode.

A filter device of the present invention is completed by mounting at least one filter chip for transmission or reception on the filter chip mounting portion of the above filter device substrate of the present invention, and wire-bonding a plurality of terminals of the filter chip to the pads and ground patterns on the substrate surface.

In the filter device of the present invention, the signal input side ground pattern and the signal output side ground pattern are connected to each other. This enhances the ground function due to both ground patterns, resulting in improvement in isolation effect.

In a specific configuration of the filter device substrate, one signal wiring pattern is formed on a surface of still another ceramic layer located above or below the another ceramic layer, while one via is provided in at least one ceramic layer interposed between the signal wiring pattern and the signal input pad or the signal output pad, the signal wiring pattern having one end thereof connected via the via to the signal input pad or the signal output pad, with the other end of the signal wiring pattern being connected via one side electrode to one foot terminal.

According to the specific configuration, the signal input side ground pattern and the signal output side ground pattern are formed on a ceramic layer different from the ceramic layer having the signal wiring pattern formed thereon. Therefore, the connection wiring pattern for connecting both ground patterns to each other can be highly flexibly designed with respect to the location and shape, without being prevented by the signal wiring pattern. The signal wiring pattern shaped so as to have an inductance component could improve signal pass characteristics in a signal pass band of the filter chip.

As described above, according to the filter device substrate and filter device of the present invention, a higher isolation effect than a conventional one can be achieved with a simple structure of two ground patterns being connected.

DETAILED DESCRIPTION OF THE INVENTION

The present invention embodied in an antenna duplexer will be specifically described below with reference to the drawings.

Figure 1:
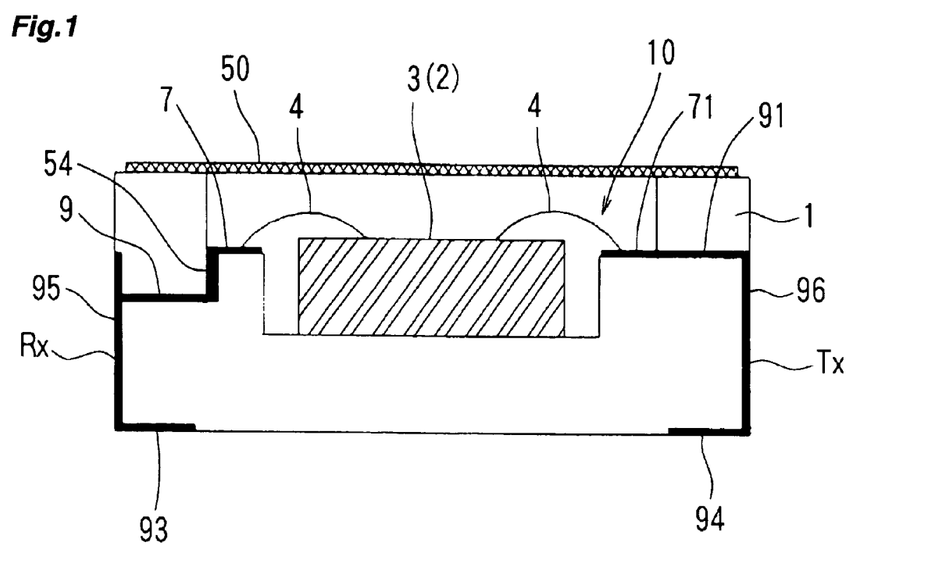
FIG. 1 is a sectional view schematically representing a structure of an antenna duplexer of the present invention.
Figure 2:
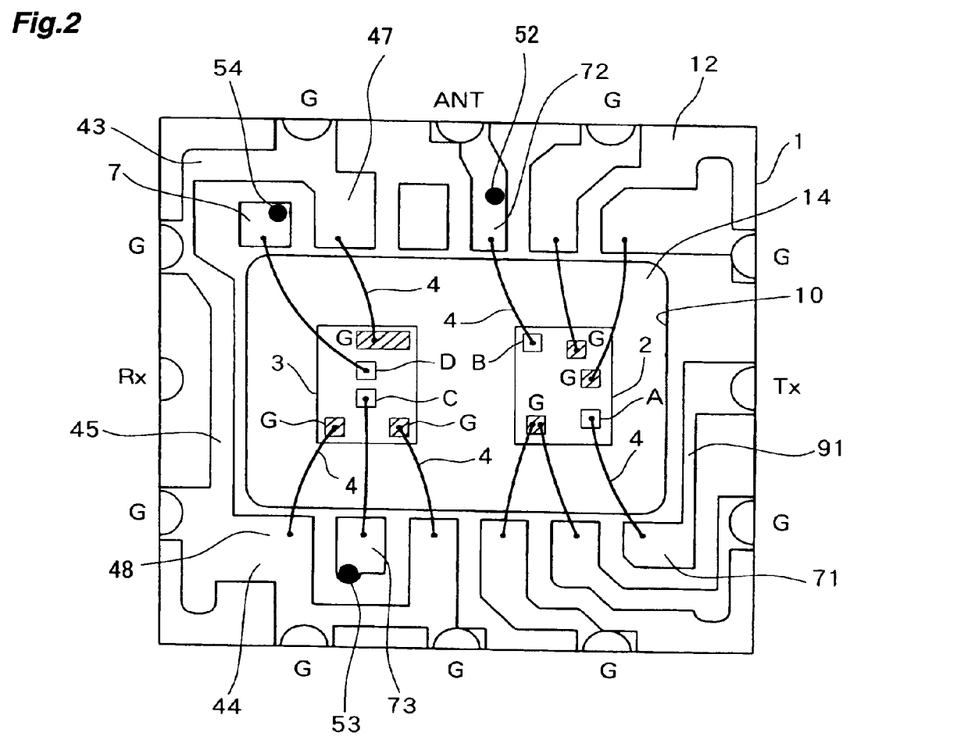
FIG. 2 is a plan view of the antenna duplexer of the present invention without a lid.

As shown in FIG. 10, an antenna duplexer of the present invention includes an antenna terminal ANT to be connected to an antenna, a transmission side signal terminal Tx to be connected to a transmitting circuit, and a reception side signal terminal Rx to be connected to a receiving circuit. The antenna terminal ANT is connected to the transmission side signal terminal Tx via a transmission filter chip 2 including a surface acoustic wave device, and connected to the reception side signal terminal Rx via a phase-matching strip line 6 and a reception filter chip 3 including a surface acoustic wave device. FIG. 1 and FIG. 2 show a packaging structure of the antenna duplexer of the present invention. A cavity 10 is provided on a surface of a substrate 1 formed by stacking a plurality of ceramic layers. The transmission filter chip 2 and the reception filter chip 3 are mounted on the bottom surface of the cavity 10. A plurality of terminals provided on these filter chips are respectively coupled by wires 4 to a plurality of surrounding pads 7, 71. As shown in FIG. 1, a plurality of side electrodes 95, 96 for serving as a plurality of external terminals of the transmission side signal terminal Tx, the reception side signal terminal Rx, etc. are formed on side surfaces of the substrate 1. The plurality of pads 7, 71 are connected via signal wiring patterns 9, 91 and the side electrodes 95, 96 to foot terminals 93, 94 formed on the reverse surface of the substrate 1. The cavity 10 of the substrate 1 is closed by a lid 50.

Figure 3:
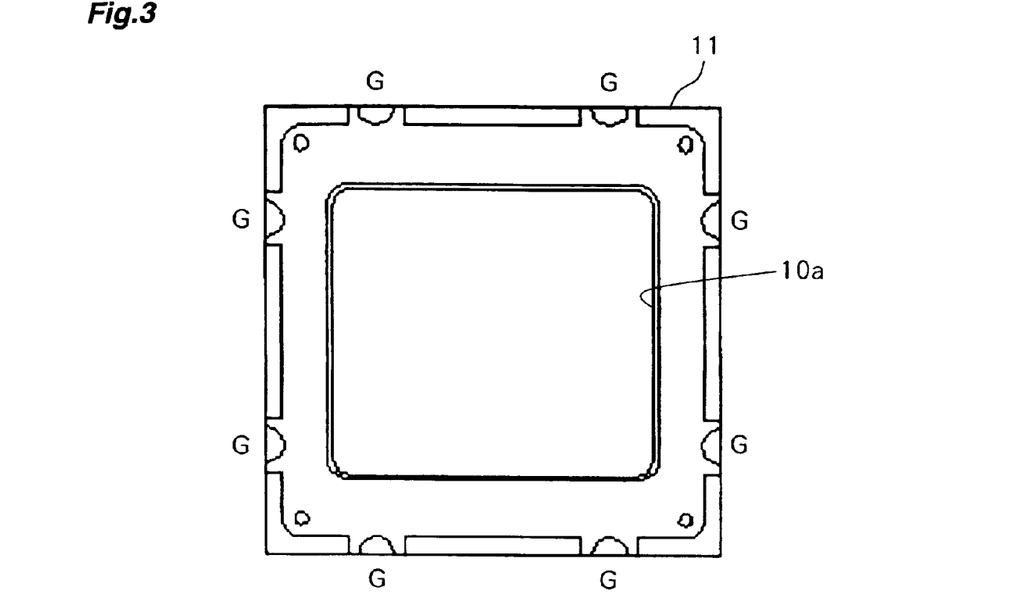
FIG. 3 is a plan view of a first ceramic layer.
Figure 4:
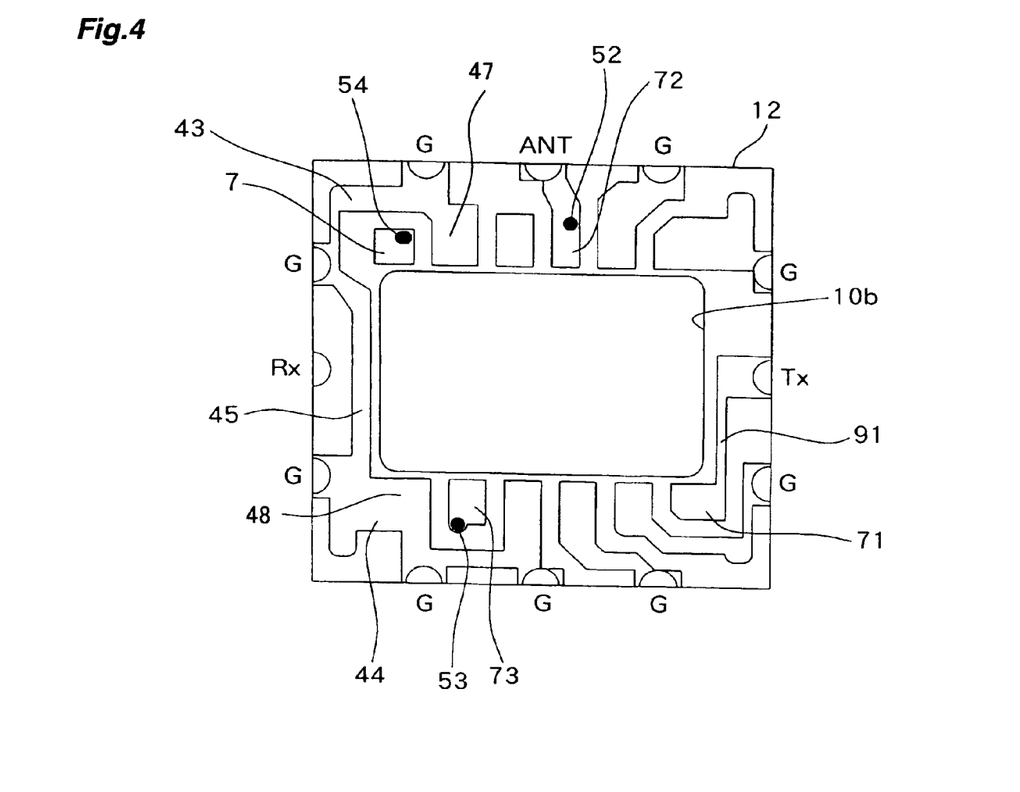
FIG. 4 is a plan view of a second ceramic layer.

FIG. 3 to FIG. 9 show seven ceramic layers 11-17 of the substrate 1. In FIG. 1 to FIG. 9, reference characters Tx, Rx, ANT, A, B, C and D represent parts of the transmission side signal terminal Tx, the reception side signal terminal Rx, the antenna terminal ANT, input and output terminals A, B of the transmission filter chip 2 and input and output terminals C, D of the reception filter chip 3, respectively, shown in FIG. 10. Further, a reference character G represents a part of ground terminals. As shown in FIG. 3, a top first ceramic layer 11 has a cavity 10a provided at the middle thereof. As shown in FIG. 4, a cavity 10b is provided at the middle of a second ceramic layer 12. A plurality of signal input and output pads 7, 71, 72, 73 and ground pads 47, 48 to be wire-bonded to a plurality of input and output terminals and a plurality of ground terminals, respectively, of the transmission filter chip 2 and the reception filter chip 3 as shown in FIG. 2, ground patterns 43, 44 coupled to the ground pads 47, 48, and a plurality of wiring patterns 91, 45 are formed on a surface of the ceramic layer 12, surrounding the cavity 10b. The signal output pad 7 is located closest to a side surface of the substrate 1 among a pad group having aligned therein a plurality of pads including the signal output pad 7 and the signal output side ground pad 47 to be connected to the output terminal and a ground terminal, respectively, of the reception filter chip 3. The signal output side ground pattern 43 and the signal input side ground pattern 44 are formed near the signal output pad 7 and the signal input pad 73, respectively, surrounding these pads 7, 73.

Figure 5:
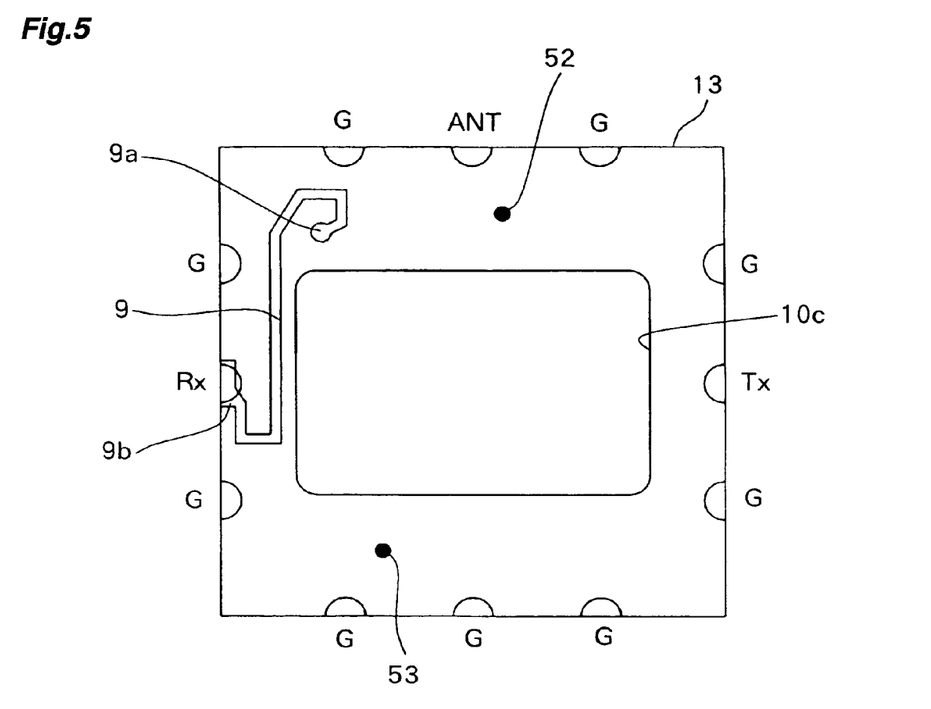
FIG. 5 is a plan view of a third ceramic layer.
Figure 6:
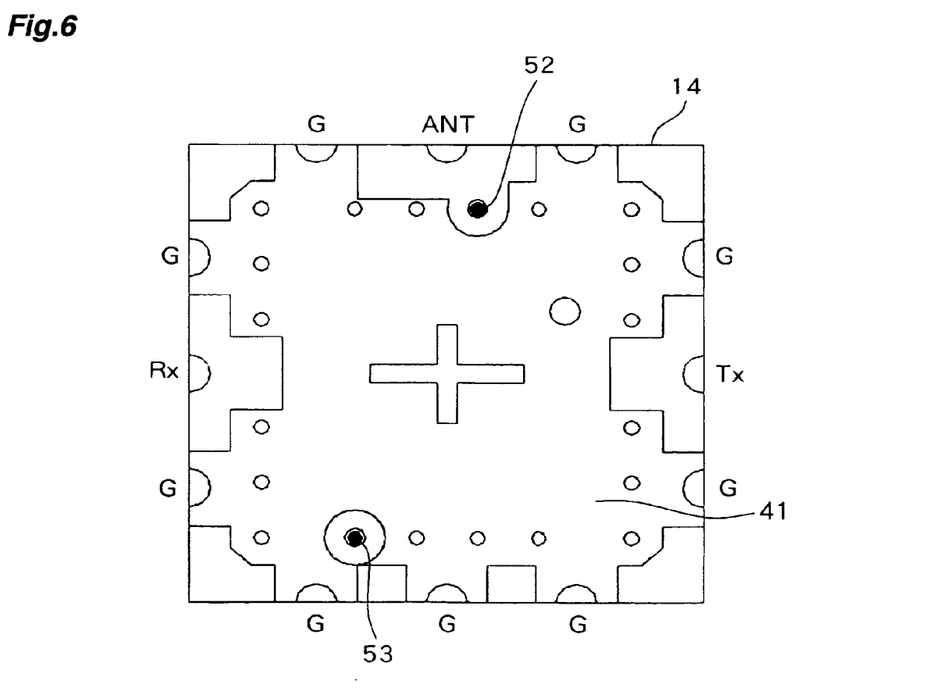
FIG. 6 is a plan view of a fourth ceramic layer.
Figure 7:
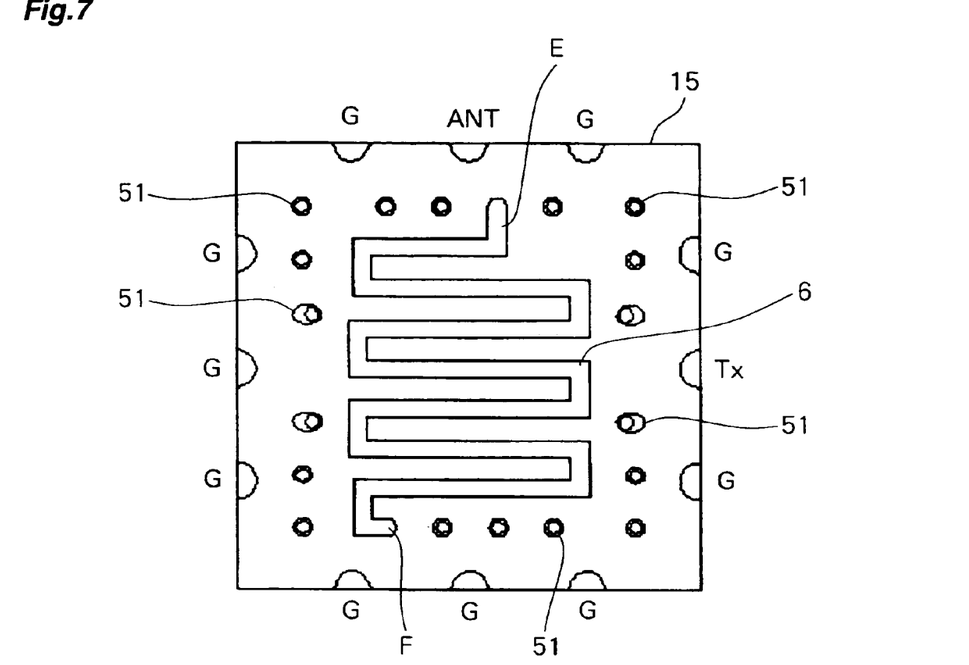
FIG. 7 is a plan view of a fifth ceramic layer.
Figure 8:
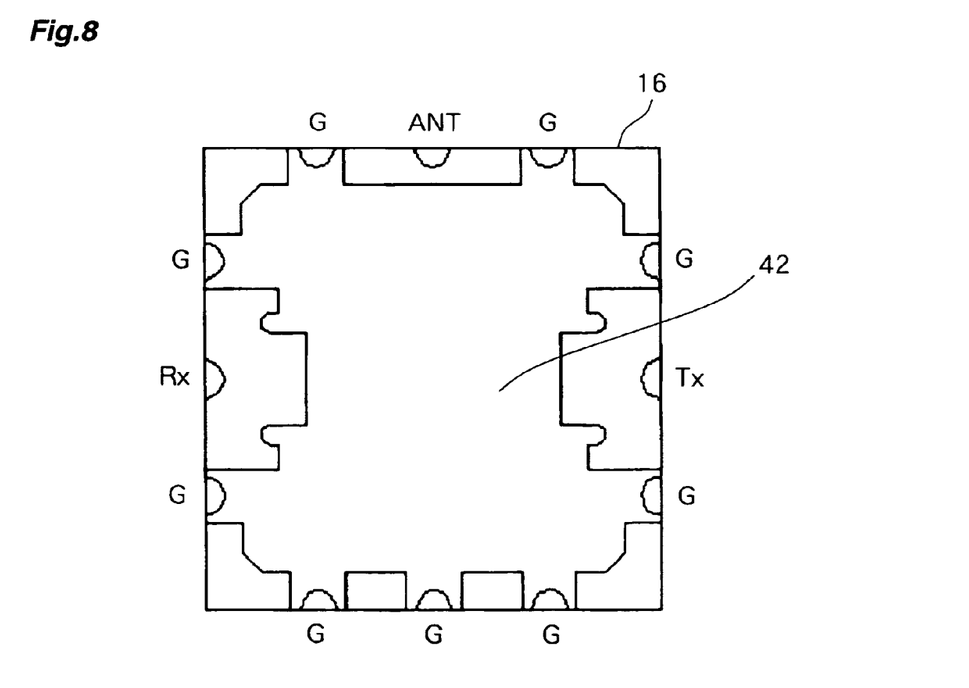
FIG. 8 is a plan view of a sixth ceramic layer.
Figure 9:
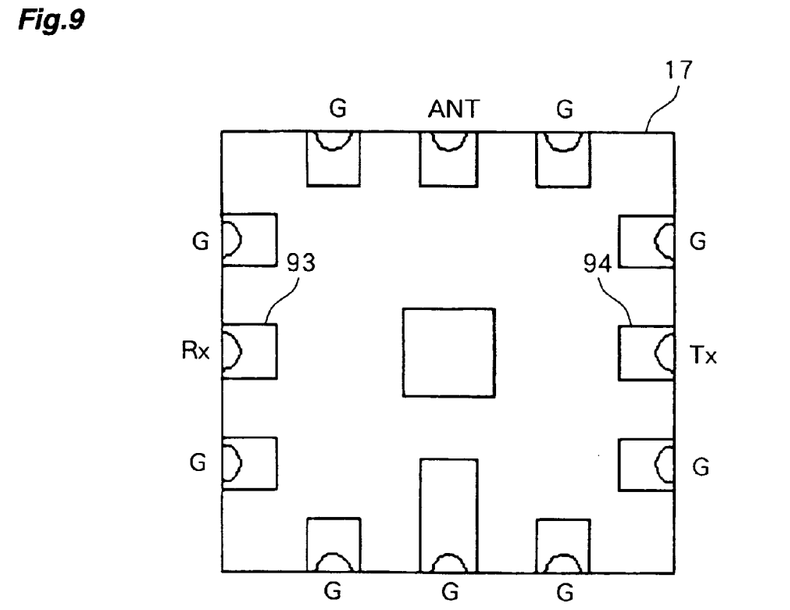
FIG. 9 is a plan view of a seventh ceramic layer.

As shown in FIG. 5, a cavity 10c is provided at the middle of a third ceramic layer 13. A reception side output signal wiring pattern 9 is formed on a surface the ceramic layer 13. One end 9b of the reception side output signal wiring pattern 9 is connected to the reception side signal terminal Rx. As shown in FIG. 6, a ground pattern 41 is formed on a surface of a fourth ceramic layer 14. The transmission filter chip 2 and the reception filter chip 3 are to be mounted on the ground pattern 41. As shown in FIG. 7, the phase-matching strip line 6 is formed on a surface of a fifth ceramic layer 15. As shown in FIG. 8, a ground pattern 42 is formed on a surface of a sixth ceramic layer 16. Further, as shown in FIG. 9, a plurality of foot terminals 93, 94 are formed on the reverse surface of a bottom seventh ceramic layer 17.

The transmission side signal terminal Tx shown in FIG. 2 is connected through the transmission side input signal wiring pattern 91 to the pad 71, and further connected via a wire 4 to the signal input terminal A of the transmission filter chip 2. The signal output terminal B of the transmission filter chip 2 is coupled via a wire 4 to the pad 72, and connected to the antenna terminal ANT. The pad 72 is connected to one terminal E of the phase-matching strip line 6 shown in FIG. 7 through a via 52 provided in the second ceramic layer 12, the third ceramic layer 13 in FIG. 5, and the fourth ceramic layer 14 in FIG. 6. The other terminal F of the phase-matching strip line 6 is connected to the pad 73 shown in FIG. 4 through a via 53 provided in the fourth ceramic layer 14 in FIG. 6, the third ceramic layer 13 in FIG. 5 and the second ceramic layer 12 in FIG. 4. As shown in FIG. 2, the pad 73 is coupled by a wire 4 to the signal input terminal C of the reception filter chip 3. The signal output terminal D of the reception filter chip 3 is coupled to the pad 7 by a wire 4. The pad 7 is connected through a via 54 provided in the second ceramic layer 12 in FIG. 4 to the other end 9a of the reception side output signal wiring pattern 9 shown in FIG. 5. The reception side output signal wiring pattern 9 has a shape to exhibit an inductance component, which improves signal pass characteristics in a signal pass band of the reception filter chip 3.

As shown in FIG. 2, two ground terminals G, G of the signal input side and signal output side of the reception filter chip 3 are connected via wires 4 to the signal input side ground pad 48 and the signal output side ground pad 47, respectively. The signal input side ground pad 48 and the signal output side ground pad 47 are coupled to the signal input side ground pattern 44 and the signal output side ground pattern 43, respectively. As shown in FIG. 4, the signal input side ground pattern 44 and the signal output side ground pattern 43 are connected to each other by a connection wiring pattern 45 formed on the surface of the second ceramic layer 12. The connection wiring pattern 45 crosses between the signal output pad 7 and the side electrode for serving as the external terminal of the reception side signal terminal Rx. Further, the ground pattern 41 shown in FIG. 6 and the ground pattern 42 shown in FIG. 8 are connected to each other via a plurality of vias 51 provided in the fifth ceramic layer 15 as shown in FIG. 7.

As shown in FIG. 2, in the above antenna duplexer of the present invention, the signal input side ground pattern 44 and signal output side ground pattern 43 for the reception filter chip 3 are formed on the second ceramic layer 12, and connected to each other by the connection wiring pattern 45, and therefore a high isolation effect can be achieved as described later. In addition, the reception side output signal wiring pattern 9, which is formed conventionally on the same ceramic layer as for the ground patterns 43, 44, is moved and provided on the third ceramic layer 13 as shown in FIG. 5, so that the pad 7 of the second ceramic layer 12 shown in FIG. 2 is connected through the via 54 to the reception side output signal wiring pattern 9 of the third ceramic layer 13. Therefore, the connection wiring pattern 45 for connecting both ground patterns 43, 44 to each other can be highly flexibly designed with respect to the shape and location, without being prevented by the reception side output signal wiring pattern 9. Consequently, excellent signal pass characteristics are realized.

Figure 19:
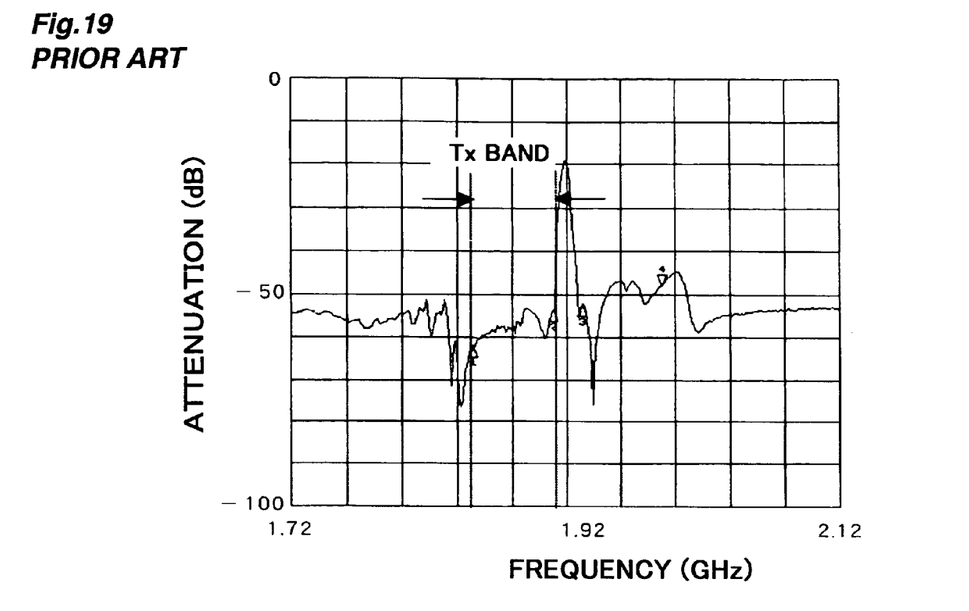
FIG. 19 is a graph showing signal pass characteristics of the conventional antenna duplexer.
Figure 20:
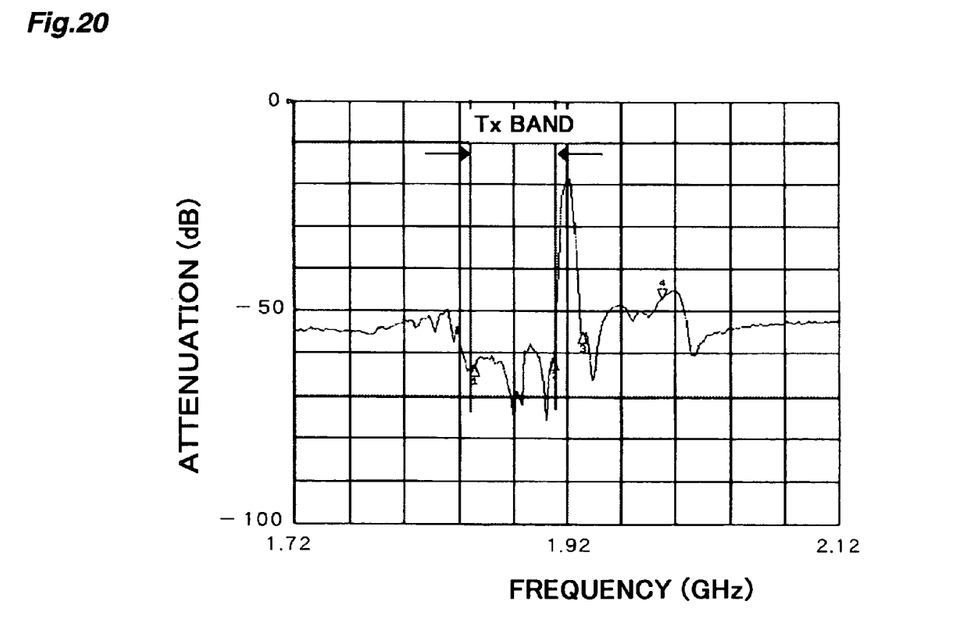
FIG. 20 is a graph showing signal pass characteristics of the antenna duplexer of the present invention.

FIG. 19 represents a result of measurement for signal pass characteristics of the conventional antenna duplexer shown in FIG. 11 to FIG. 18. FIG. 20 represents a result of measurement for signal pass characteristics of the antenna duplexer of the present invention shown in FIG. 1 to FIG. 9. As illustrated, the antenna duplexer of the present invention shown in FIG. 20 gives a greater attenuation in the signal pass band (Tx band) by about 10 dB than that of the conventional antenna duplexer shown in FIG. 19. This indicates that the antenna duplexer of the present invention is superior to the conventional antenna duplexer in isolation characteristics.

The present invention is not limited to the foregoing embodiment in construction but can be modified variously within the technical scope as set forth in the appended claims. Of the transmission filter chip 2 and the reception filter chip 3 in the above embodiment, only the reception filter chip 3 has the signal input side ground pattern and the signal output side ground pattern connected to each other. However, each of both filter chips 2, 3 may have the signal input side ground pattern and the signal output side ground pattern connected to each other, for example. Only the transmission filter chip 2 may have the signal input side ground pattern and the signal output side ground pattern connected to each other. The present invention may be embodied, not only in the antenna duplexer having both the transmission filter chip 2 and the reception filter chip 3 mounted thereon, but also in filter devices having any one filter chip mounted thereon.

The invention claimed is:

1. A filter device substrate comprising a plurality of ceramic layers stacked on top of each other; a cavity provided for containing at least one filter chip for transmission or reception; a filter chip mounting portion for mounting the filter chip on one ceramic layer constituting a bottom surface of the cavity; a plurality of side electrodes provided on one or more side surfaces of the plurality of stacked ceramic layers and extending in a stacked direction of the ceramic layers; a signal input pad, a signal output pad, a signal input side ground pad and a signal output side ground pad for connecting a signal input terminal, a signal output terminal, a signal input side ground terminal and a signal output side ground terminal, respectively, of the filter chip, and a signal input side ground pattern and a signal output side ground pattern to be connected to the signal input side ground pad and the signal output side ground pad, respectively, provided on a surface of another ceramic layer different from the ceramic layer having the filter chip mounting portion; a connection wiring pattern for connecting the signal input side ground pattern and the signal output side ground pattern to each other on the surface of the another ceramic layer; and foot terminals to which the signal input pad, the signal output pad, the signal input side ground pattern and the signal output side ground pattern are respectively connected via side electrodes, the signal input pad or the signal output pad being located closest to a side electrode to be connected thereto of the pads of at least one pad group of an input side pad group including the signal input pad and the input side ground pad and an output side pad group including the signal output pad and the output side ground pad, the connection wiring pattern crossing the ceramic layer surface area defined between the signal input pad or the signal output pad and at least one side electrode.

2. The filter device substrate according to claim 1, wherein one signal wiring pattern is formed on a surface of still another ceramic layer located above or below the ceramic layer provided with the signal input pad and the signal output pad, while one via hole is provided in at least one ceramic layer interposed between the signal wiring pattern and the signal input pad or the signal output pad, the signal wiring pattern having one end thereof connected to the signal input pad or the signal output pad via a conductive material in the via hole, with the other end of the signal wiring pattern being connected via one side electrode to one foot terminal.

3. The filter device substrate according to claim 2, wherein the signal wiring pattern has an inductance component.

4. A filter device comprising a substrate formed by stacking a plurality of ceramic layers; a cavity for containing at least one filter chip for transmission or reception, provided on a surface of the substrate; a filter chip mounting portion for mounting the filter chip on one ceramic layer constituting a bottom surface of the cavity; a plurality of side electrodes provided on one or more side surfaces of the plurality of stacked ceramic layers and extending in a stacked direction of the ceramic layers; a signal input pad, a signal output pad, a signal input side ground pad and a signal output side ground pad having wire-bonded thereto a signal input terminal, a signal output terminal, a signal input side ground terminal and a signal output side ground terminal, respectively, of the filter chip, and a signal input side ground pattern and a signal output side ground pattern to be connected to the signal input side ground pad and the signal output side ground pad, respectively, provided on a surface of another ceramic layer different from the ceramic layer having the filter chip mounting portion; a connection wiring pattern for connecting the signal input side ground pattern and the signal output side ground pattern to each other on the surface of the another ceramic layer; and foot terminals to which the signal input pad, the signal output pad, the signal input side ground pattern and the signal output side ground pattern are respectively connected via side electrodes, the signal input pad or the signal output pad being located closest to a side electrode to be connected thereto of the pads of at least one pad group of an input side pad group including the signal input pad and the input side ground pad and an output side pad group including the signal output pad and the output side ground pad, the connection wiring pattern crossing the ceramic layer surface area defined between the signal input pad or the signal output pad and at least one side electrode.

5. The filter device according to claim 4, wherein a transmission filter chip and a reception filter chip are mounted on the surface of the substrate, and the signal input side ground pattern and the signal output side ground pattern of any one chip or each of both chips are connected to each other by the connection wiring pattern.

* * * * *